(12) United States Patent
Bennett

(10) Patent No.: US 10,720,308 B2
(45) Date of Patent: Jul. 21, 2020

(54) PLASMA APPARATUS

(71) Applicant: SPTS Technologies Limited, Newport (GB)

(72) Inventor: Paul Bennett, Bristol (GB)

(73) Assignee: SPTS Technologies Limited, Newport (GB)

( * ) Notice: Subject to any disclaimer, the term of this patent is extended or adjusted under 35 U.S.C. 154(b) by 0 days.

(21) Appl. No.: 16/541,582

(22) Filed: Aug. 15, 2019

(65) Prior Publication Data
US 2020/0058466 A1 Feb. 20, 2020

(30) Foreign Application Priority Data
Aug. 17, 2018 (GB) .................................. 1813451.0

(51) Int. Cl.
H01J 37/32 (2006.01)
H05H 1/46 (2006.01)

(52) U.S. Cl.
CPC ...... H01J 37/321 (2013.01); H01J 37/32357 (2013.01); H01J 37/32532 (2013.01); H05H 1/46 (2013.01); H05H 2001/4667 (2013.01)

(58) Field of Classification Search
None
See application file for complete search history.

(56) References Cited

U.S. PATENT DOCUMENTS

| | | | |
|---|---|---|---|
| 6,495,963 B1 * | 12/2002 | Bennett | H01J 37/321 118/723 E |
| 6,815,633 B1 | 11/2004 | Chen et al. | |
| 7,541,558 B2 | 6/2009 | Smith et al. | |
| 2003/0071035 A1 | 4/2003 | Brailove | |
| 2011/0114601 A1 * | 5/2011 | Lubomirsky | H01J 37/3211 216/68 |
| 2013/0118589 A1 | 5/2013 | Hu et al. | |

(Continued)

FOREIGN PATENT DOCUMENTS

| | | |
|---|---|---|
| EP | 3214637 A1 | 9/2017 |
| KR | 101881537 B1 | 2/2017 |

OTHER PUBLICATIONS

EPO, ESR for EP19188193, Dec. 6, 2019.

*Primary Examiner* — Jany Richardson
(74) *Attorney, Agent, or Firm* — Hodgson Russ LLP

(57) ABSTRACT

A plasma apparatus includes a remote plasma source, a substrate processing chamber, and a connector which connects the remote plasma source to the substrate processing chamber. The remote plasma source includes a continuous peripheral wall structure that surrounds an inner channel, and that includes an electrode structure that defines at least a part of an internal channel extending internally within the continuous peripheral wall structure in which the inductively coupled plasma can be sustained. The remote plasma source also includes an electrical signal supply device for supplying an electrical signal that drives the electrode structure, and a plasma outlet which is in communication with the internal channel. The connector is in connection with the plasma outlet of the remote plasma source and the substrate processing chamber so that at least some components of the inductively coupled plasma sustained in the internal channel can be introduced to the substrate processing chamber.

22 Claims, 3 Drawing Sheets

(56) References Cited

U.S. PATENT DOCUMENTS

| | | |
|---|---|---|
| 2014/0062285 A1* | 3/2014 | Chen ........................ H05H 1/24 |
| | | 313/231.31 |
| 2016/0163512 A1 | 6/2016 | Lubomirsky |
| 2016/0163513 A1 | 6/2016 | Lubomirsky |
| 2017/0062183 A1 | 3/2017 | Taniguchi et al. |
| 2017/0092470 A1* | 3/2017 | Ramaswamy .... H01J 37/32091 |
| 2017/0256384 A1 | 9/2017 | Bennett |
| 2018/0092196 A1 | 3/2018 | Notomi et al. |
| 2018/0122619 A1* | 5/2018 | Uhm ........................ H05H 1/30 |

\* cited by examiner

PLASMA APPARATUS

BACKGROUND

This invention relates to a plasma apparatus. This invention also relates to associated methods of performing a treatment step using said plasma apparatus. This invention further relates to a remote plasma source for sustaining an inductively coupled plasma.

Plasma processing techniques are commonly used in many industrial applications, such as in semiconductor processing. The plasma used in plasma processing techniques may be generated in a number of ways. One of the more common methods is using an inductively coupled plasma (ICP) source. An ICP source may be a remote plasma generation source, or the plasma may be inductively coupled within the processing chamber directly.

Typically, an inductively coupled plasma is generated by applying an RF signal to an antenna, coil or band that is positioned externally to a processing chamber. The antenna, coil or band forms a primary winding of a transformer, and is used to couple energy into the processing chamber via a dielectric container or window. If a suitable gas or gaseous mixture is introduced into the processing chamber at a suitably low pressure, a gas discharge is produced. The removal of heat from this type of system can be a problem, owing to the relatively poor thermal conductivity of convention dielectric materials. It is possible to use more advanced dielectric materials with improved thermal characteristics. An example of an advanced dielectric material is AlN. However, these advanced materials are costly and also they impose design limitations which limit their use in many applications.

European patent application published as EP3214637 discloses a chamber having walls comprising a metallic band, which acts as a single turn structure of an ICP plasma source. The metallic band is disposed between two dielectric sections. The dielectric sections have different thermal expansion coefficients to the metallic band, and can lead to problems with thermal expansion mismatch.

It is desirable to more efficiently dissipate heat from the plasma generation source and processing chamber, whilst avoiding thermal expansion mismatch. There is also a need to operate a plasma processing chamber at higher plasma densities in order to increase reaction speeds. For example, a plasma with a high density is typically used during cleaning steps to more efficiently remove residues from the processing chamber. It is also desirable to develop a processing chamber suitable for operating at higher power, with an improved coupling efficiency between the power inputted and the plasma generated.

SUMMARY

The present invention in at least some of its embodiments, seeks to address some of the above described problems, desires and needs. The present invention, in at least some of its embodiments, provides an apparatus for generating and sustaining an inductively coupled plasma that allows improved heat removal from the plasma source, thereby allowing a plasma having an increased plasma density to be generated. The present invention further allows a high coupling efficiency between the input power and the plasma.

According to a first aspect of the invention there is a plasma apparatus comprising:
 a remote plasma source;
 a substrate processing chamber; and
 a connector which connects the remote plasma source to the substrate processing chamber;
 wherein:
 the remote plasma source comprises: a continuous peripheral wall structure that surrounds an inner channel, the continuous peripheral wall structure comprising an electrode structure that defines at least a part of an internal channel extending internally within the continuous peripheral wall structure in which the inductively coupled plasma can be sustained, wherein the internal channel is spaced apart from the inner channel; an electrical signal supply device for supplying an electrical signal that drives the electrode structure as a primary winding of an inductively coupled plasma source to sustain the inductively coupled plasma within the internal channel; and a plasma outlet which is in communication with the internal channel; and
 the connector is in connection with the plasma outlet of the remote plasma source and the substrate processing chamber so that at least some components of the inductively coupled plasma sustained in the internal channel can be introduced to the substrate processing chamber.

The internal channel is typically spaced apart from the inner channel by an inner portion of the continuous peripheral wall structure. It is apparent that the internal channel and the inner channel are discrete and separate channels. A remote plasma source having a continuous peripheral wall structure allows a high density plasma to be generated and sustained in the internal channel.

The continuous peripheral wall structure may have a generally toroidal geometry, for example, the continuous peripheral wall structure may be a toroidal polyhedron, a toroid, a torus, ring or ring-like, looped, annular or of any other similar geometry. Other configurations, such as configurations in which the continuous peripheral wall structure is helical or spiral, might be contemplated.

The cross-sectional shape of the inner channel may be a polygon, a circle or an ellipse. The polygon may be a regular polygon. The cross-sectional shape of the inner channel may be a four-sided polygon, or preferably a six-sided polygon. A circular cross-section of the inner channel provides the optimum geometry for maximising the magnetising inductance, and hence maximising the efficiency, of the remote plasma source. However, a polygonal cross-section may also achieve good efficiencies. An inner channel having a polygonal cross-section facilitates the manufacture of the continuous peripheral wall structure, and may provide easier vacuum sealing between any wall segments of the continuous peripheral wall structure.

The internal channel may partially or completely surround the inner channel. The internal channel may form a closed loop surrounding the inner channel. The internal channel may have a substantially toroidal geometry. The internal channel may be a torus or toroid. Typically the internal channel defines a gas and/or a plasma path. The cross-sectional shape bounded by the internal channel may correspond to or be in conformity with the cross-sectional shape of the inner channel. The cross-sectional shape bounded by the internal channel may be a polygon, a circle or an ellipse. The cross-sectional shape bounded by the internal channel may be a four-sided polygon, or preferably a six-sided polygon.

The electrode structure may be a single turn structure.

The electrode structure may comprise a plurality of spaced apart wall segments. The electrode structure may form a single turn around a periphery of the inner channel. The electrode structure may comprise at least four wall segments, preferably at least six wall segments. Forming the electrode structure from a plurality of wall segments facilitates manufacture. Each wall segment may define a linear section of the internal channel. This further facilitates manufacture and can assist in forming a suitable vacuum seal between each wall segment.

The wall segments may be spaced apart by one or more portions of the continuous peripheral wall structure formed from a dielectric material. The dielectric material may be silicone, quartz or ceramic. The wall segments may be spaced apart by one or more gaskets formed from a dielectric material. Spacing apart the wall segments with a dielectric material, such as a silicone gasket, can advantageously provide a dielectric break in the electrode structure whilst also providing a suitable seal between the wall segments.

The wall segments may be connected in parallel to the electrical signal supply device. The wall segments may be grounded at their midpoints. The wall segments may be symmetrically driven around ground potential, for example by using a balun.

The electrode structure may be a metallic material. The metallic material may be copper, aluminium or stainless steel. Heat may be dissipated efficiently from a metallic electrode structure, thereby removing heat from the continuous peripheral wall structure. Such an efficient method of heat removal allows higher powers to be applied to the electrode structure, permitting the generation of higher density plasma.

In the invention, the electrode structure is in direct communication with the interior of the internal channel. Positioning the electrode structure in direct communication with the interior of the internal channel provides for more efficient inductive coupling, allows for a wider power/pressure operation regime, and reduces transformer action leakage inductance.

The inner channel may be spaced apart from the internal channel by a distance of not more than 50 mm, preferably not more than 25 mm. A smaller spacing between the inner channel and the internal channel increases the magnetising inductance, and hence the efficiency, of the remote plasma source. The cross-sectional area of the inner channel is preferably as large as possible with respect to the cross-sectional area bounded by the internal channel.

The continuous peripheral wall structure may further comprise a cooling system for cooling the electrode structure. The cooling system may comprise an internal cooling channel extending internally within the continuous peripheral wall structure to permit a coolant fluid to be flowed therethrough. This is a very convenient way of achieving significant cooling of the electrode structure in a very straightforward manner.

The remote plasma source may further comprise a gas inlet for introducing a gas into the internal channel.

An auxiliary winding may be disposed in the inner channel to induce a driving current in the electrode structure. This facilitates impedance matching. The auxiliary winding may be a coil.

The substrate processing chamber may comprise a substrate support.

The substrate processing chamber may be a plasma-enhanced chemical vapour deposition (PECVD) chamber The electrical signal supply device may supply an RF electrical signal that drives the electrode structure. The electrical signal supply device may supply an electrical signal that drives a current in the electrode structure so that the electrode structure acts as the primary winding of an inductively coupled plasma source.

According to a second aspect of the invention there is a method of performing a treatment step using the plasma apparatus of the first aspect, the method comprising the steps of:

supplying an electrical signal to the electrode structure to drive the electrode structure as a primary winding of an inductively coupled plasma source to sustain an inductively coupled plasma within the internal channel; and introducing at least some components of the inductively coupled plasma from the internal channel to the substrate processing chamber via the connector.

The treatment step may be a cleaning step which cleans the substrate processing chamber. The substrate processing chamber may be a plasma-enhanced chemical vapour deposition (PECVD) chamber.

According to a third aspect of the invention there is a remote plasma source for sustaining an inductively coupled plasma comprising:

a continuous peripheral wall structure that surrounds an inner channel, the wall structure comprising an electrode structure that defines at least a part of an internal channel extending internally within the continuous peripheral wall structure in which the inductively coupled plasma can be sustained, wherein the internal channel is spaced apart from the inner channel;

an electrical signal supply device for supplying an electrical signal that drives the electrode structure as a primary winding of an inductively coupled plasma source to sustain the inductively coupled plasma within the internal channel; and a plasma outlet which is in communication with the internal channel and allows the remote plasma source to be connected to a substrate processing chamber so that at least some components of the inductively coupled plasma sustained in the internal channel can be introduced to the substrate processing chamber.

According to a fourth aspect of the invention there is a method of sustaining an inductively coupled plasma using the remote plasma source of the third aspect, the method comprising the steps of:

supplying an electrical signal that drives the electrode structure as a primary winding of an inductively coupled plasma source to sustain an inductively coupled plasma within the internal channel.

Whilst the invention has been described above, it extends to any inventive combination of the features set out above, or in the following description, drawings or claims. For example, any features disclosed in relation to the first aspect of the invention may be combined with any features of the third aspect of the invention.

BRIEF DESCRIPTION OF THE DRAWINGS

Embodiments of substrates and methods in accordance with the invention will now be described with reference to the accompanying drawings, in which.

DETAILED DESCRIPTION OF EMBODIMENTS

Figure 1:
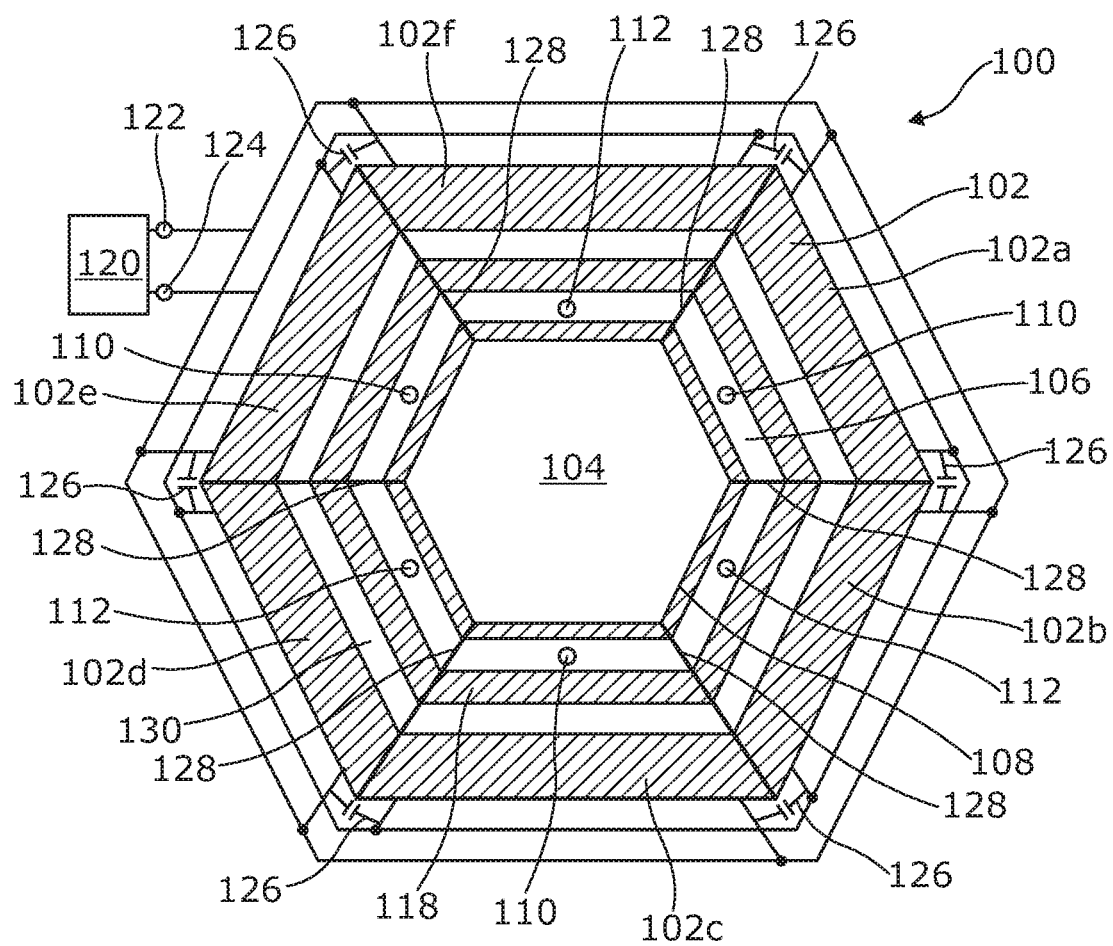
FIG. 1 is a schematic cross-sectional view of a remote plasma source according to the first embodiment.

FIG. 1 shows a first embodiment of a remote inductively coupled plasma (ICP) source, depicted generally at 100, suitable for generating and sustaining an inductively coupled plasma in accordance with the invention. The remote ICP source 100 comprises a continuous peripheral wall structure 102 that surrounds an inner channel 104. In the first embodiment, the wall structure 102 forms a continuous looped structure. In some embodiments, the wall structure 102 has a generally toroidal geometry. In the first embodiment, the wall structure 102 comprises six wall segments 102a-f, which are arranged to form a hexagonal wall structure. The hexagonal wall structure defines the perimeter of the inner channel 104, which accordingly has a hexagonal cross-section. It will be appreciated that any number of wall segments may conveniently be used to define the perimeter of the inner channel to establish a polygonal cross-section.

In other embodiments, the cross-sectional shape of the inner channel 104 is circular or elliptical. A circular cross-section of the inner channel provides an optimal geometry for maximising the magnetising inductance, and hence maximising the efficiency, of the remote inductively coupled plasma source. However, a polygonal cross-section also achieves good efficiencies. An inner channel having a polygonal cross-section facilitates the manufacture of the continuous peripheral wall structure, and provides for easier vacuum sealing between adjacent wall segments 102a-f of the continuous peripheral wall structure 102.

Figure 2:
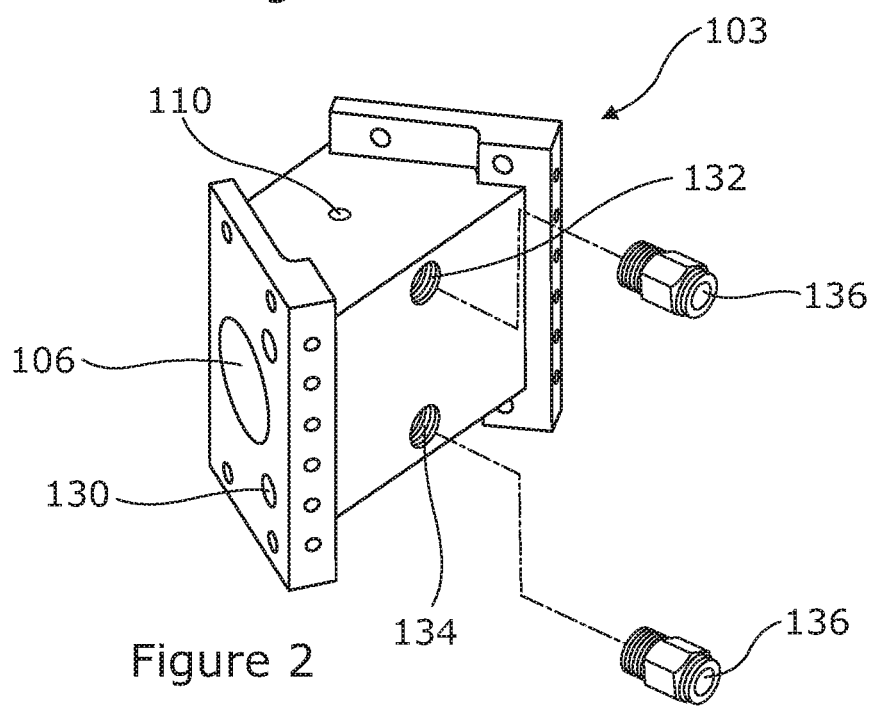
FIG. 2 is a schematic perspective view of a portion of the remote plasma source according to the first embodiment.

FIG. 2 illustrates a single wall segment 103 of the first embodiment. The wall structure 102 further comprises an internal channel 106 that defines a gas and/or plasma path. The internal channel 106 extends internally within the continuous peripheral wall structure 102. The internal channel 106 is spaced apart from the inner channel 104 by an inner portion of the wall structure 108. In the first embodiment, the internal channel 106 forms a continuous path internally within the wall structure 102.

To maximise the magnetising inductance, and hence to maximise the efficiency, the internal channel preferably forms an annular or toroidal path within the wall structure 102. However, it is typically more convenient to machine a number of wall segments 103 each comprising a linear section of the internal channel, which, when assembled, forms a polygonal path, such as a three-sided, four-sided or six-sided polygon. This can also help to ensure and maintain adequate vacuum sealing between the wall segments. The internal channel 106 may have a polygonal perimeter having any convenient number of sides.

The cross-sectional area of the inner channel 104 is preferably as large as possible with respect to the cross-sectional area bounded by the internal channel 106. This is typically achieved by positioning the internal channel near to the inner perimeter of the continuous peripheral wall structure 102. Conveniently, the inner channel 104 is spaced apart from the internal channel 106 by a distance of not more than 50 mm, optionally, by not more than 25 mm.

The cross-sectional shape bounded by the internal channel 106 conveniently has the same geometry as the cross-sectional shape of the inner channel 104. However, in some embodiments, this is not the case.

Figure 4:
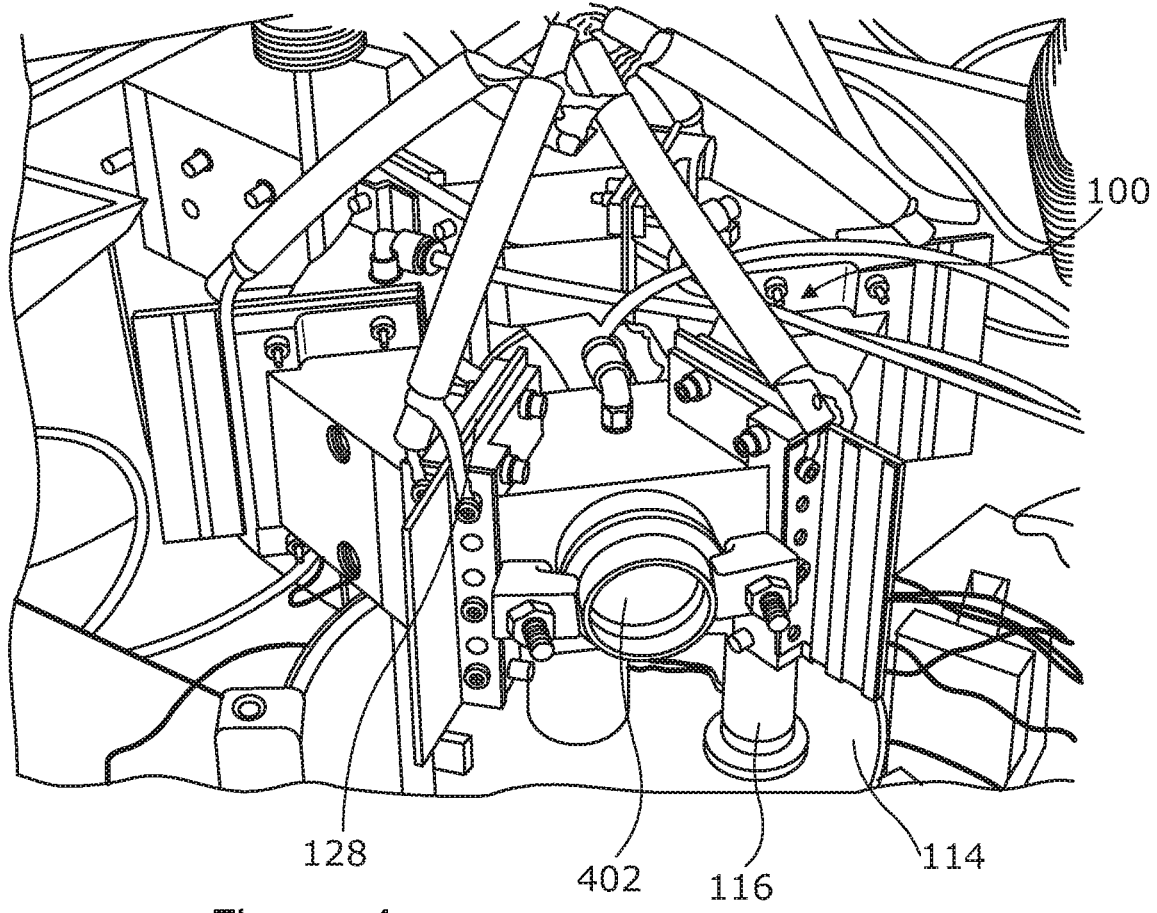
FIG. 4 is a perspective view of an apparatus according to the first embodiment.
Figure 5:
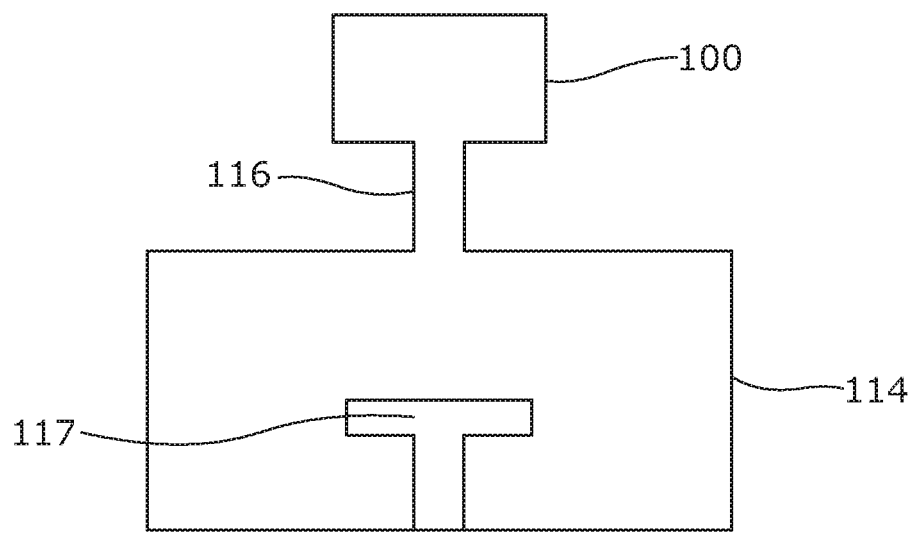
FIG. 5 is a schematic illustration of a remote plasma source coupled to a substrate processing chamber.

The internal channel 106 has at least one gas inlet 110 and at least one plasma outlet 112. The gas inlet 110 allows gas to be introduced into the internal channel 106. The plasma outlet 112 allows at least some components of the plasma to exit the internal channel 106. The gas inlet 110 and plasma outlet 112 are optionally arranged in adjacent and/or alternating wall segments. The plasma outlet 112 is connectable to a substrate processing chamber 114 via a connector 116 (FIGS. 4 and 5). By way of example only, the substrate processing chamber 114 may be any convenient type of plasma deposition chamber or plasma etch chamber. The substrate processing chamber 114 typically comprises a substrate support 117.

The walls defining the internal channel 106 are an electrode structure 118. The electrode structure 118 is typically formed from a metallic material, such as copper, aluminium or stainless steel. In the first embodiment, the electrode structure 118 is formed from aluminium. A metallic electrode structure 118 is relatively easy to cool due to relatively high thermal conductance of the metallic material. This can enable at least one of high power operation, high pressure operation, and high thermal loading to be achieved without requiring the use of a thermally robust dielectric chamber wall formed from an exotic material, such as AlN. Providing an electrode structure 118 that is in direct communication with the interior of the internal channel 106 reduces transformer action leakage inductance, improves the coupling efficiency, and allows the ICP source to operate at a wider range of powers and pressures.

In some embodiments, the electrode structure acts as a single turn of a primary winding of an ICP source. The skilled reader will appreciate that a single turn electrode structure cannot extend completely around the wall structure 102. It is convenient to provide at least one electrical break, such as a dielectric break, in the electrode structure 118. Conveniently, each wall segment 102a-f is separated by a relatively thin dielectric break 128. The dielectric break 128 can be formed of any convenient dielectric material, such as silicone, ceramic or quartz. In the first embodiment, the dielectric break 128 is a silicone gasket.

In the first embodiment, each wall segment 102a-f comprises a portion of the electrode structure. This reduces thermal expansion mismatch within each wall segment 102a-f.

The electrode structure 118 is in electrical communication with an RF power supply 120. More specifically, the electrode structure 118 is in electrical connection with the RF power supply 120 through feed points 122, 124. The wall segments 102a-f are connected in parallel with tuning capacitors 126 connected across adjacent wall segments. The capacitors 126 tune the electrode structure 118 to the drive frequency provided by the RF power supply 120. The frequency of the RF electrical signal provided by the RF power supply 120 may be 13.56 MHz, 2 MHz or any other convenient frequency. The RF supply may conveniently be coupled by high pass filtering. Frequency tuning may be employed to provide matching over a range of power and pressure conditions. Matching may be achieved using PI or L networks or transformers. Matching may also be achieved by using a coupling coil disposed in the inner channel 104 to induce a driving current in the surrounding continuous peripheral wall structure 102.

The use of N wall segments connected in parallel reduces the applied voltage by a factor N. This can be advantageous in suppressing electric coupling around the dielectric breaks and feed points. However, it is also possible to drive the wall segments 102a-f in series. If a single turn with one dielectric break is tuned by capacitance, then for a structure comprising N wall segments, each dielectric is tuned by CN. In the arrangements shown in FIGS. 1 and 3, N is six. Other values of N are possible. With a high N value, the impedance may be less than 50 Ohms. In this instance, a step down from a typical generator may be required.

The power applied may conveniently be coupled by a balun such that each wall segment is symmetrically driven around ground potential. The wall segments 102a-f may have their midpoint grounded to minimise sputtering and other undesirable effects associated with the applied voltage. The gas inlet 110 and plasma outlet 112 may conveniently be positioned at the grounded midpoint of a wall segment. Selective grounding of the segments can also be used to assist in initially striking the plasma.

A low gas pressure is typically used to facilitate the ignition of the plasma. The pressure may be increased after plasma ignition, for example during a treatment step. Striking of the plasma can also be assisted by using additional RF, AC or DC potentials briefly applied between the source and ground. In the case of electrode structures having a plurality of segments, it is possible to power adjacent segments with alternate polarities of an additional (auxiliary) power supply to assist in striking the plasma.

It will be appreciated that the apparatus described in FIGS. 1 to 4 utilises an ICP source which is fundamentally different from known prior art ICP sources. In particular, the ICP source of the invention utilises the wall of the internal channel itself as the primary winding of the ICP source. Therefore, the primary winding is immediately adjacent to the inductively coupled plasma itself within the chamber. This can lead to more efficient coupling, wider power/pressure operation regime, and reduced transformer action leakage inductance. Operation at high power, high pressure, and/or high thermal loading is also possible.

The wall structure further comprises a cooling system for cooling the electrode structure 118. The cooling system comprises at least one internal cooling channel 130 extending internally within the continuous peripheral wall structure 102. A coolant fluid is typically circulated through the cooling channel 130 via the coolant inlet 132 to remove heat from the electrode structure 118. The coolant fluid exits the cooling channel 130 via the coolant outlet 134. The coolant inlet 132 and coolant outlet 134 are conveniently diametrically opposed about the continuous peripheral wall structure 102. The coolant fluid is typically water. The coolant inlet 132 and coolant outlet 134 may be coupled to coolant connectors 136.

Figure 3:
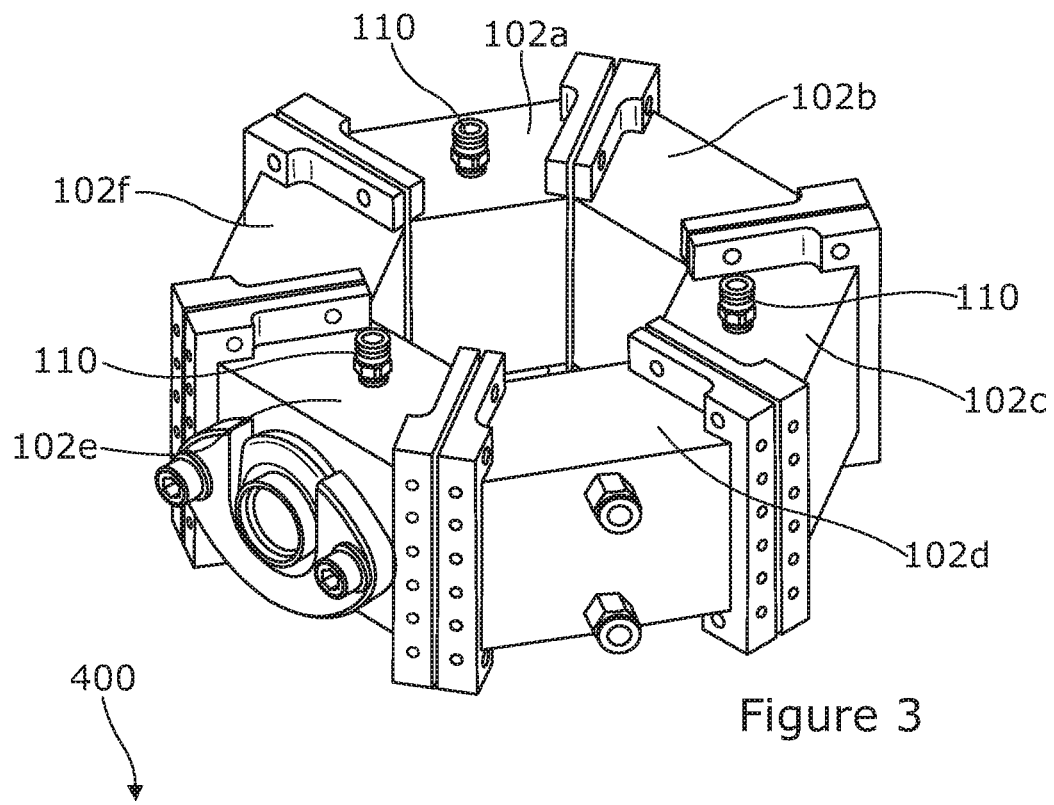
FIG. 3 is a schematic perspective view of a remote plasma source according to the first embodiment.

FIG. 4 shows a plasma apparatus 400 comprising the remote inductively coupled plasma source 100 shown in FIGS. 1-3 coupled to a substrate processing chamber 114. The electrode structure 118 is in direct communication with the interior of the internal channel 106. In this embodiment, the electrode structure extends to the exterior surface of the wall structure 102. Each wall segment 102a-f is separated by a silicone gasket acting as a dielectric break 128. Use of a silicone gasket also serves to form a suitable seals between adjacent wall segments. In particular, the gasket seals the internal channel 106 and the internal cooling channel 130.

One or more gasses are introduced into the internal channel 106 via one or more gas inlets 110. The internal channel 106 also comprises a plasma outlet 112 allowing plasma to exit the internal channel 106. The gas inlet 110 and plasma outlet 112 are arranged so that the gas/plasma flow has a path that is substantially perpendicular to the direction of current in the electrode structure 118. In some embodiments, the gas inlet 110 and plasma outlet 112 are conveniently arranged so that the gas/plasma flow has a path that is substantially parallel to the direction of current in the electrode structure 118.

An inductively coupled plasma is generated and sustained in the internal channel 106. The inductively coupled plasma can be viewed through an optional viewing window 402. Since the electrode structure 118 forms the walls of the internal channel 106 and since the internal channel 106 forms a continuous looped path extending within the wall structure 102, the inductively coupled plasma also has a continuous path within the internal channel 106. That is, the plasma forms a continuous path rather than being confined to a particular region of the internal channel 106. A continuous, looped plasma path allows higher plasma densities to be achieved within the internal channel 106. By way of example only, a high density plasma is beneficial for performing cleaning treatments on substrate processing chambers. Further, by using the electrode structure 118 as the walls of the continuous internal channel 106, thermal expansion mismatch is minimised.

Components of the high density inductively coupled plasma exit from the internal channel 106 via the plasma outlet 112. The components exiting from the plasma outlet 112 typically comprise at least one of ions and/or radicals. The plasma outlet 112 is in communication with a substrate processing chamber 114 via a connector 116. The connector 116 may be a pipe or another other suitable conduit. The components of the plasma may enter the substrate processing chamber 114 via a showerhead or any other suitable means. The substrate processing chamber 114 is typically a chamber for processing a semiconductor substrate. The substrate processing chamber 114 may conveniently be a pumping chamber; a deposition chamber, such as a PVD, PECVD or CVD chamber; or an etch chamber.

If the plasma was generated in the substrate processing chamber 114 itself, for example by electrically driving a shower head or a platen, then ion-bombardment would occur which typically will wear down the chamber parts over a period of time. By providing the ICP source as a remote plasma source, it is possible to supply radical species to the substrate processing chamber 114 with no significant concentrations of ions reaching the substrate processing chamber 114. In this way, a fast, low damage process can be provided. For example, the substrate processing chamber 114 may be cleaned using radical species supplied from the remote plasma source 100.

In addition to cleaning treatments, such a remote inductively coupled plasma source may also have applications in dissociating a process gas to facilitate chemical reactions for etching or depositing micron and sub-micron films in the manufacture of semiconductor devices. A high density plasma may increase the rate of such chemical reactions and processes.

What is claimed is:

1. A plasma apparatus comprising:
a remote plasma source;
a substrate processing chamber; and
a connector which connects the remote plasma source to the substrate processing chamber;
wherein:
the remote plasma source comprises: a continuous peripheral wall structure that surrounds an inner channel, the continuous peripheral wall structure comprising an electrode structure that defines at least a part of an internal channel extending internally within the continuous peripheral wall structure in which the inductively coupled plasma is sustained wherein the internal channel is spaced apart from the inner channel; an electrical signal supply device for supplying an electrical signal that drives the electrode structure as a primary winding of an inductively coupled plasma source to sustain the inductively coupled plasma within the internal channel; and a plasma outlet which is in communication with the internal channel; and the connector is in connection with the plasma outlet of the remote plasma source and the substrate processing chamber so that at least some components of the inductively coupled plasma sustained in the internal channel is introduced to the substrate processing chamber.

2. The plasma apparatus according to claim 1 in which the internal channel partially or completely surrounds the inner channel.

3. The plasma apparatus according to claim 1 in which the electrode structure is a single turn structure.

4. The plasma apparatus according to claim 1 in which the electrode structure comprises a plurality of spaced apart wall segments.

5. The plasma apparatus according to claim 4 in which the wall segments are spaced apart by one or more portions of the continuous peripheral wall structure formed from a dielectric material.

6. The plasma apparatus according to claim 4 in which the wall segments are connected in parallel to the electrical signal supply device.

7. The plasma apparatus according to claim 4 in which the wall segments are grounded at their midpoints.

8. The plasma apparatus according to claim 4 in which the electrode structure comprises at least four wall segments.

9. The plasma apparatus according to claim 8 in which the electrode structure comprises at least six wall segments.

10. The plasma apparatus according to claim 1 in which the electrode structure is a metallic material.

11. The plasma apparatus according to claim 10 in which the metallic material is copper, aluminium, or stainless steel.

12. The plasma apparatus according to claim 1 in which the inner channel is spaced apart from the internal channel by a distance of not more than 50 mm.

13. The plasma apparatus according to claim 12 in which the inner channel is spaced apart from the internal channel by a distance of not more than 25 mm.

14. The plasma apparatus according to claim 1 in which the continuous peripheral wall structure further comprises a cooling system for cooling the electrode structure.

15. The plasma apparatus according to claim 14 in which the cooling system comprises an internal cooling channel extending internally within the continuous peripheral wall structure to permit a coolant fluid to be flowed therethrough.

16. The plasma apparatus according to claim 1 in which the remote plasma source further comprises a gas inlet for introducing a gas into the internal channel.

17. The plasma apparatus according to claim 1 in which an auxiliary winding is disposed in the inner channel to induce a driving current in the electrode structure.

18. The plasma apparatus according to claim 1 in which the electrical signal supply device supplies an RF electrical signal that drives the electrode structure.

19. A method of performing a treatment step using the plasma apparatus according to claim 1, the method comprising the steps of:

supplying an electrical signal to the electrode structure to drive the electrode structure as a primary winding of an inductively coupled plasma source to sustain an inductively coupled plasma within the internal channel; and introducing at least some components of the inductively coupled plasma from the internal channel to the substrate processing chamber via the connector.

20. The method according to claim 19 in which the treatment step is a cleaning step which cleans the substrate processing chamber.

21. A remote plasma source for sustaining an inductively coupled plasma comprising:

a continuous peripheral wall structure that surrounds an inner channel, the wall structure comprising an electrode structure that defines at least a part of an internal channel extending internally within the continuous peripheral wall structure in which the inductively coupled plasma is sustained, wherein the internal channel is spaced apart from the inner channel;

an electrical signal supply device for supplying an electrical signal that drives the electrode structure as a primary winding of an inductively coupled plasma source to sustain the inductively coupled plasma within the internal channel; and a plasma outlet which is in communication with the internal channel and allows the remote plasma source to be connected to a substrate processing chamber so that at least some components of the inductively coupled plasma sustained in the internal channel is introduced to the substrate processing chamber.

22. A method of sustaining an inductively coupled plasma using the remote plasma source of claim 21, the method comprising the steps of:

supplying an electrical signal that drives the electrode structure as a primary winding of an inductively coupled plasma source to sustain an inductively coupled plasma within the internal channel.

* * * * *